(12) United States Patent
McMichael

(10) Patent No.: US 10,601,440 B2
(45) Date of Patent: Mar. 24, 2020

(54) METHOD OF COMPRESSION FOR FIXED-LENGTH DATA

(71) Applicant: KinematicSoup Technologies Inc., Kelowna (CA)

(72) Inventor: Justin McMichael, Kelowna (CA)

(73) Assignee: KinematicSoup Technologies Inc., Kelowna (CA)

( * ) Notice: Subject to any disclaimer, the term of this patent is extended or adjusted under 35 U.S.C. 154(b) by 0 days.

(21) Appl. No.: 15/741,337

(22) PCT Filed: Jul. 4, 2016

(86) PCT No.: PCT/CA2016/050780
§ 371 (c)(1),
(2) Date: Jan. 2, 2018

(87) PCT Pub. No.: WO2017/004708
PCT Pub. Date: Jan. 12, 2017

(65) Prior Publication Data
US 2018/0198463 A1 Jul. 12, 2018

Related U.S. Application Data

(60) Provisional application No. 62/188,554, filed on Jul. 3, 2015.

(51) Int. Cl.
*H03M 7/30* (2006.01)
*H03M 7/40* (2006.01)
*H04L 29/06* (2006.01)
*A63F 13/31* (2014.01)

(52) U.S. Cl.
CPC ............ *H03M 7/3077* (2013.01); *A63F 13/31* (2014.09); *H03M 7/30* (2013.01); *H03M 7/3079* (2013.01); *H03M 7/3086* (2013.01); *H03M 7/4018* (2013.01); *H03M 7/4056* (2013.01); *H04L 67/38* (2013.01); *H04L 69/04* (2013.01); *A63F 2300/534* (2013.01)

(58) Field of Classification Search
CPC .......................... H03M 7/3077; H03M 7/3079
USPC ........................................... 341/87
See application file for complete search history.

(56) References Cited

U.S. PATENT DOCUMENTS

| 5,815,096 A * | 9/1998 | Smith ................. H03M 7/3088 |
| | | 341/51 |
| 6,668,092 B1 * | 12/2003 | Sriram ..................... H03M 7/30 |
| | | 382/244 |
| 8,976,474 B1 * | 3/2015 | Wang .................. G11B 20/1426 |
| | | 341/50 |
| 2013/0135123 A1 | 5/2013 | Golander et al. |

OTHER PUBLICATIONS

Supplementary European Search Report on corresponding EP patent application No. 16820599.5, dated Jan. 25, 2019.
(Continued)

*Primary Examiner* — Lam T Mai

(57) ABSTRACT

The disclosure is directed at a method of data compression. The method includes creating a set of single composite data structures and then calculating a set of bit probabilities based on the set of single data structures. The bit probabilities are then used to create a set of intermediate buffers which are then sorted and traversed for data compression.

15 Claims, 13 Drawing Sheets

(56) References Cited

OTHER PUBLICATIONS

Wikipedia: "Entropy (information theory)", Wikipedia, May 15, 2015, XP002788312, Retrieved from the Internet: URL: https://en.wikipedia.org/w/index.php?title=Entropy_(information_theory)&oldid=666997433 [retrieved on Jan. 24, 2019].
Wikipedia: "Delta encoding", Internet article, May 17, 2015, XP002788320, Retrieved from the Internet: URL: https://en.wikipedia.org/w/index.php?title=Delta_encoding&oldid=662681226 [retrieved on Jan. 25, 2019].
Anonymous: "Deflate—Wikipedia, the free encyclopedia", Aug. 10, 2014, XP055243054, Retrieved from the Internet: URL: http://web.archive.org/web/20140810113008/http://en.wikipedia.org/wiki/Deflate [retrieved on Jan. 20, 2016].
Thinh Nguyen: "Lecture 7: Run-Length, Golomb, and Tunstall Codes", Internet Citation, May 9, 2006, XP002762453, Retrieved from the Internet: URL: http://web.engr.oregonstate.edu/~thinhq/teaching/ece499/spring06/runlength_turnstall_golomb.pdf.

* cited by examiner

METHOD OF COMPRESSION FOR FIXED-LENGTH DATA

CROSS-REFERENCE TO OTHER APPLICATIONS

This application claims the benefit of U.S. Patent Application No. 62/188,554, filed Jul. 3, 2015, the contents of which are incorporated herein by reference.

FIELD OF THE DISCLOSURE

The disclosure is generally directed to real-time multi-player games, and more specifically, to a method of compression for fixed-length data.

BACKGROUND OF THE DISCLOSURE

The popularity of online gaming has increased over the years. More and more individuals are starting to become engaged in playing real-time multi-player games. In order to enhance the player experience with these games, new improvements and enhancements are regularly introduced or innovated.

In some cases, these improvements relate to the player's interaction with the game in terms of the computer graphic interface or with respect to new challenges or tasks to achieve.

In order to fully appreciate changes to the computer graphic interface, other improvements to the game may be needed which are not visible to the player. For instance, a faster Internet connection may be beneficial to the player's game play.

Therefore, there is provided a method of improving a user's experience with a real-time multi-player game.

SUMMARY OF THE DISCLOSURE

In one aspect of the disclosure, there is provided a method of data compression which includes combining a set of fixed-size binary data structures into a set of single composite data structures wherein a single composite data structure is structured with a predetermined number of fixed-size binary data structures and then aligning bits of each single composite data structure with corresponding bits in the other single composite data structures. The bit probabilities for each bit position of the single composite data structures is then calculated and stored as a bit probability data structure. A re-ordering model based on the bit probability data structure is the created and the bits of each single composite data structure re-ordered based on the re-ordering model to form intermediate buffers of each single composite data structure.

In another aspect of the disclosure, the intermediate buffers are traversed. In another aspect, the intermediate buffers are sorted in ascending order and then the sorted list of intermediate buffers is traversed. In a further embodiment, traversing the intermediate buffers includes calculating a delta bit string buffer for each intermediate buffer and encoding each delta bit string buffer. In another aspect, calculating the delta bit string buffer includes retrieving adjacent bit pairs; subtracting a lower bit value from a greater bit value to calculate a delta for the adjacent bit pairs; and repeating these steps for each pair of adjacent intermediate buffers in the sorted list of intermediate buffers.

In another aspect of the disclosure, calculating a delta bit string buffer includes retrieving adjacent bit pairs; performing an bitwise XOR calculation for each adjacent bit pairs; and repeating these steps for each pair of intermediate buffers in the sorted list of intermediate buffers. In a further aspect, traversing the sorted list of intermediate buffers includes traversing each intermediate buffer from most significant bit to least significant bit; generating paths and branches of a fixed-depth binary tree structure based on the traversing; at each leaf of the binary tree structure, encoding a location of the last branching point as branching point data; encoding the branching point data by dumping the tree in known order; removing a most encoded branch from the binary tree structure; following encoded value back to last branch; and repeating these steps for each branch.

In a second aspect of the disclosure, there is provided a method of decompression including decoding a non-delta first bit buffer; decoding a subsequent delta bit buffer; and converting encoded intermediate buffers to integers.

In a further aspect of the disclosure, there is provided adding the subsequent delta bit buffer to the non-delta first buffer to produce a decoded intermediate buffer; and repeating these steps for adjacent intermediate buffer pairs.

In yet another aspect, there is provided bitwise XOR'ing the subsequent delta bit buffer to the non-delta first buffer to produce a decoded intermediate buffer; and repeating these steps for adjacent intermediate buffer pairs.

DESCRIPTION OF THE DRAWINGS

Embodiments of the present disclosure will now be described, by way of example only, with reference to the attached Figures.

DETAILED DESCRIPTION

The disclosure is directed at a method and apparatus for data compression for fixed-length data. In one embodiment, the disclosure discloses a method that coordinates multiple fixed-length data segments. These fixed-length data segments are seen as data structures having a fixed number of bits. In one embodiment, the disclosure determines the probability of each of the bits in the fixed-length data segments and produces a re-ordering model. The re-ordering model is then used to re-align the bits in each fixed-length data segment. Each fixed-length data segment is then traversed as part of the data compression process.

In a preferred embodiment, the method of the disclosure is used in real-time multi-player games.

Figure 8:
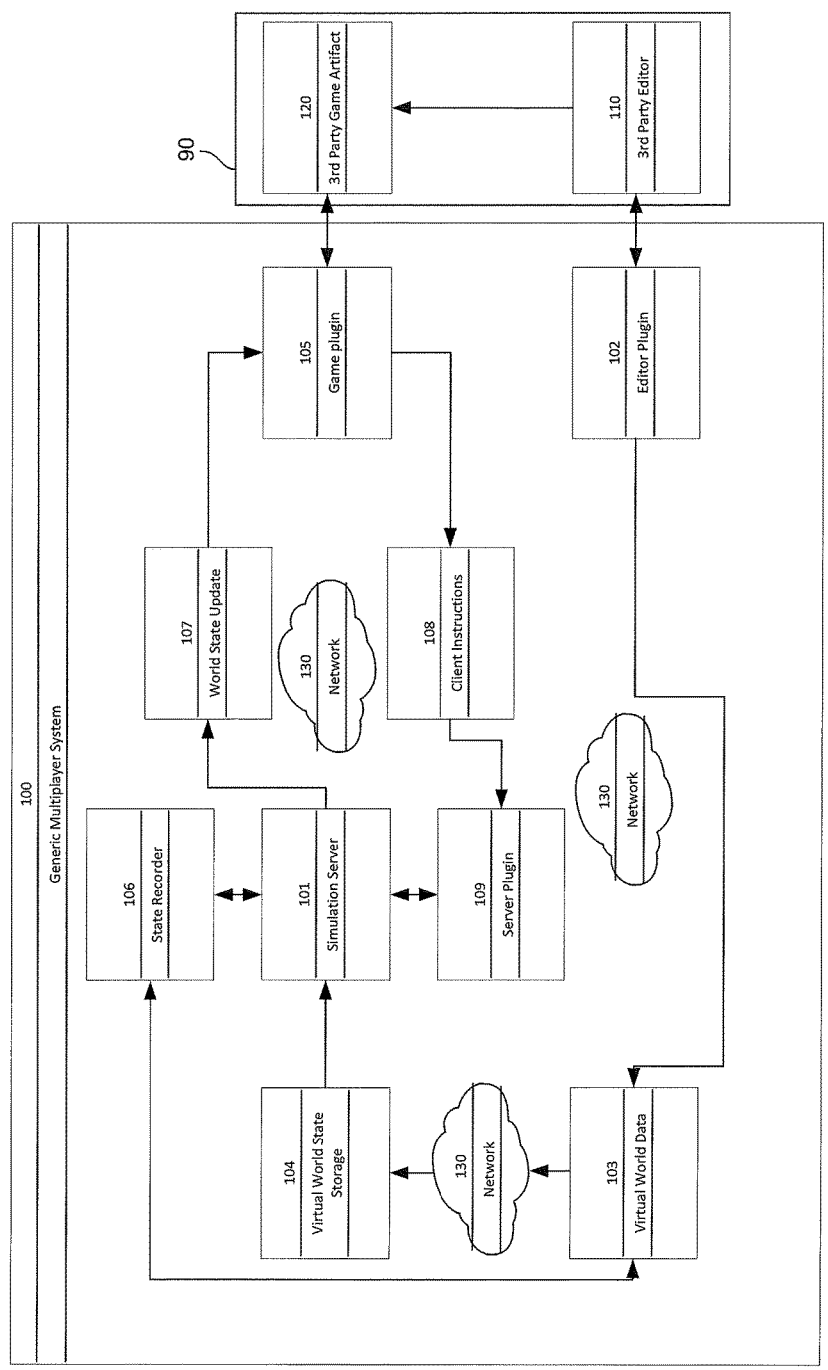
FIG. 8 is a schematic diagram of a system for a multi-player gaming system.

Turning to FIG. 8, a schematic diagram of apparatus for a multiplayer gaming system, or a generic multiplayer system, 100 is shown. This figure provides a general overview of some, but not all, components of the system. Integrated with the schematic diagram of the system 100 are boxes representing data (such as virtual world data 103 or client instructions 108) which do not form physical components of the system but are included for better understanding of the system 100.

In use, a game developer chooses a $3^{rd}$ party game engine 90 with which to develop a game (also described as a game editing flow). The game developer uses the $3^{rd}$ party game engine 90 to interact with the system 100. The $3^{rd}$ party game engine 90 typically includes or provides an integrated $3^{rd}$ party editor 110 and a $3^{rd}$ party game artifact 120.

When the game is being played by a user, an editor plugin 102 (within the system 100) communicates with the $3^{rd}$ party editor 110 that conforms to a developer's workflow. Although shown in a one-to-one relationship in FIG. 8, a single editor plugin may be associated or communicate with more than one $3^{rd}$ party editor 110 whereby the system 100 may be used for the creation of different games. When instructed by the $3^{rd}$ party editor 110, the editor plugin 102 may access virtual object data that is relevant for game simulation. The editor plugin 102 generates virtual world data 103 from virtual object data. Virtual world data may be seen as the data which is necessary to produce the gaming environment to the user. This virtual world data 103 and the virtual object data are preferably created or constructed by the game developer prior to communication being enabled between the $3^{rd}$ party editor 110 and the editor plugin 102. Although shown within the system 100, the virtual world data 103 may be stored elsewhere, such as, but not limited, to a remote database.

If the virtual world data 103 is stored in a remote database, it is retrieved by the system 100, when needed. The virtual world data 103 is then transferred over a network 130, such as a Wide Area Network (WAN), the Internet or a Local Area Network (LAN), or some combination, where it is stored in a virtual world state storage 104. After being stored in the virtual world state storage 104, the virtual world data 103 may be loaded by a simulation server 101 for display to a user who is playing the multiplayer game.

During gameplay, the simulation server 101 provides discrete world simulation, analysis, compression and streaming. The simulation server 101 also sends a world state update, or state update, 107 to each connected game plugin 105 (the means by which users are accessing and playing the game). The game plugin 105 may be stored within a network-connected computer, a laptop, a tablet or the like.

As the simulation server 101 generates discrete world states, it can store them using a state recorder 106. In the current embodiment, the state recorder 106 is a high-performance storage system which can be attached to the simulation server 101 via a system bus or other high speed network. When enabled, the state recorder 106 may store any amount of world simulation history as long as it is configured with enough storage. The state recorder 106 can also generate virtual world data 103 from a previous state that can be loaded into the simulation server 101 to rewind or replay the simulation such that a user can review prior gameplay.

In a preferred embodiment, the game plugin 105 and the simulation server 101 are connected to each other over the network 130. A game interface (within the game plugin) interfaces with the $3^{rd}$ party game artifact 120 to provide an interface allowing users to create any number of custom virtualized functions on the simulation server 101.

By developing game code that calls one of these virtualized functions (preferably serialized into client or user instructions 108), these instructions or functions may be sent to the server 101 so that they can be recorded, stored and/or executed.

In one embodiment, the simulation server 101 allows, by default, all instructions. The simulation server 101 may also allow a developer to supply a server plugin 109 to supply vetting rules. As such, not all instructions regarding game play submitted by a user may be accepted by the system 100.

In another embodiment, the simulation server 101 is scriptable whereby a developer can define and/or customize a number server-side functions. For instance, when in use, the client interface can be used to call these server-side functions. This may also be seen as a typical Remote Procedure Call system/software pattern. If necessary, these function calls can be recorded and "played back" at a later time, such as during a replay or another type of time-shift.

Figure 9:
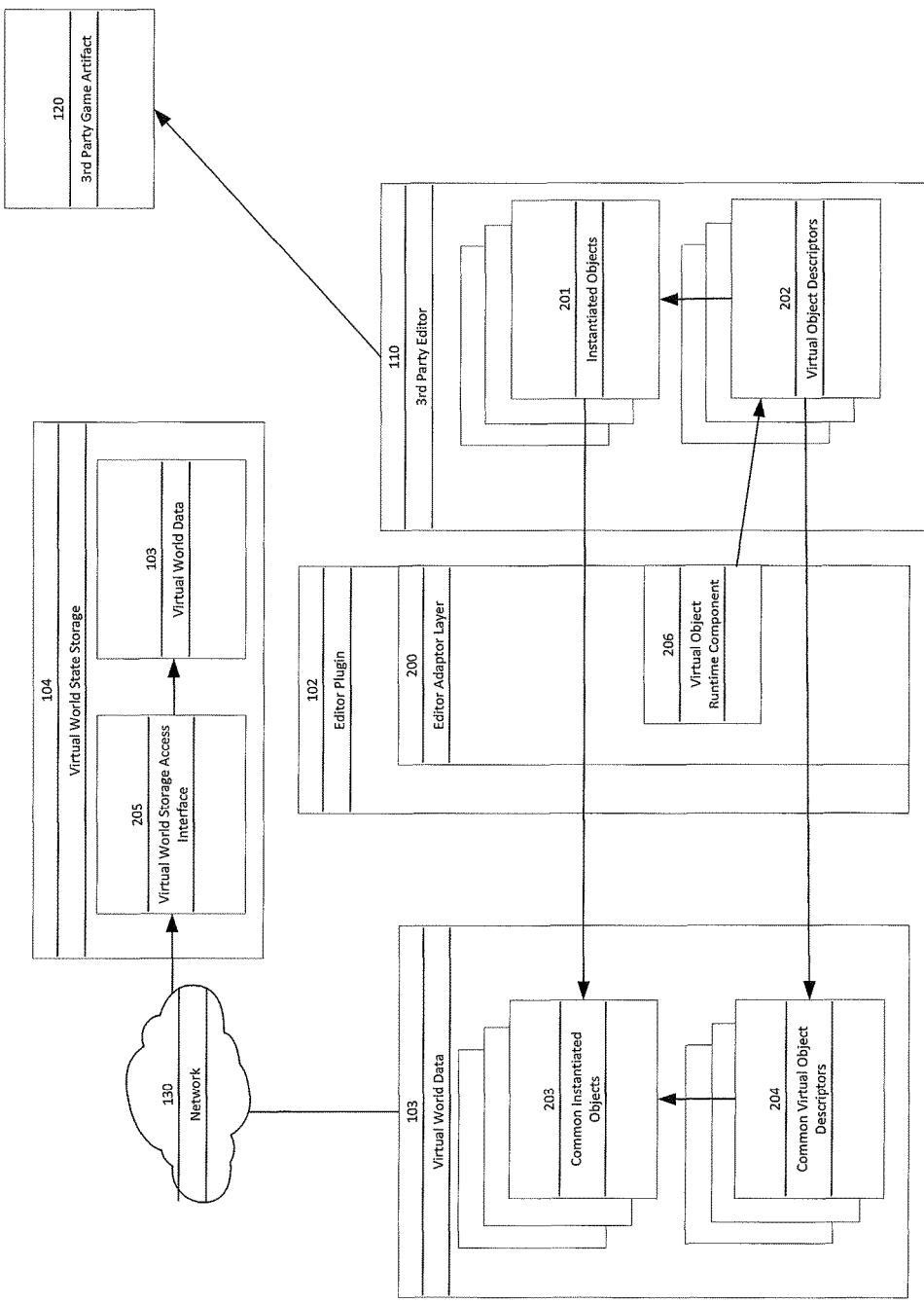
FIG. 9 is a schematic diagram depicting more details of components of the system shown in FIG. 8.

FIG. 9 is a schematic diagram depicting more details of components of the system shown in FIG. 8. More specifically, FIG. 9 depicts how a virtual word is created using an editor. The editor plugin of the disclosure assists to transform the virtual world data 103 into a common format, before uploading it to the system of the disclosure.

The editor plugin 102 includes an editor adaptor layer 200 that is specific to one $3^{rd}$ party editor 110 and accesses all the virtual world data 103 associated with the $3^{rd}$ party editor 110. The $3^{rd}$ party editor 110 itself is, in one embodiment, a visual tool which provides a visual representation of the virtual world being assembled and updated in real-time. As would be understood, the virtual world represents the scenario within which the game is being played. To assist in the development of the virtual world, the developer defines a set of one or more virtual object descriptors 202 which includes graphical data such as, but not limited to, geometry and textures, optional units of logic that are executed by the $3^{rd}$ party game artifact 120 at run-time, and various physical attribute data such as mass, velocity, and forces. Some of the virtual object descriptors are instantiated into a set of one or more instantiated objects 201 in order to create run-time for the virtual world. At run-time, the $3^{rd}$ party game artifact 120 generates a virtual world from the list of instantiated objects 201. The editor adaptor layer 200 automatically attaches a virtual object runtime component 206 to each of the virtual object descriptors 202 to facilitate simulation and to provide the developer with an interface to influence the state of the simulation. This interface provides access to read and set simulation-specific properties such object position and rotation, as well as custom data provided by users, and optionally physics properties such as mass, damping, friction, collision masks, etc. The editor adaptor layer 200 parses both the virtual object descriptors 202 and the instantiated objects 201 in the editor and stores the respective data in common formats that is independent of the $3^{rd}$ party editor 110 and the game engine. As stated above, the editor 110 generates virtual world data 103 which contains both the common instantiated objects 203 and the common virtual object descriptors 204 on which they are based. This data is sent over the network 130 to be stored. The editor stores the data by connecting to the virtual world storage access interface 205 which provides read and write access to the underlying data.

Figure 10:
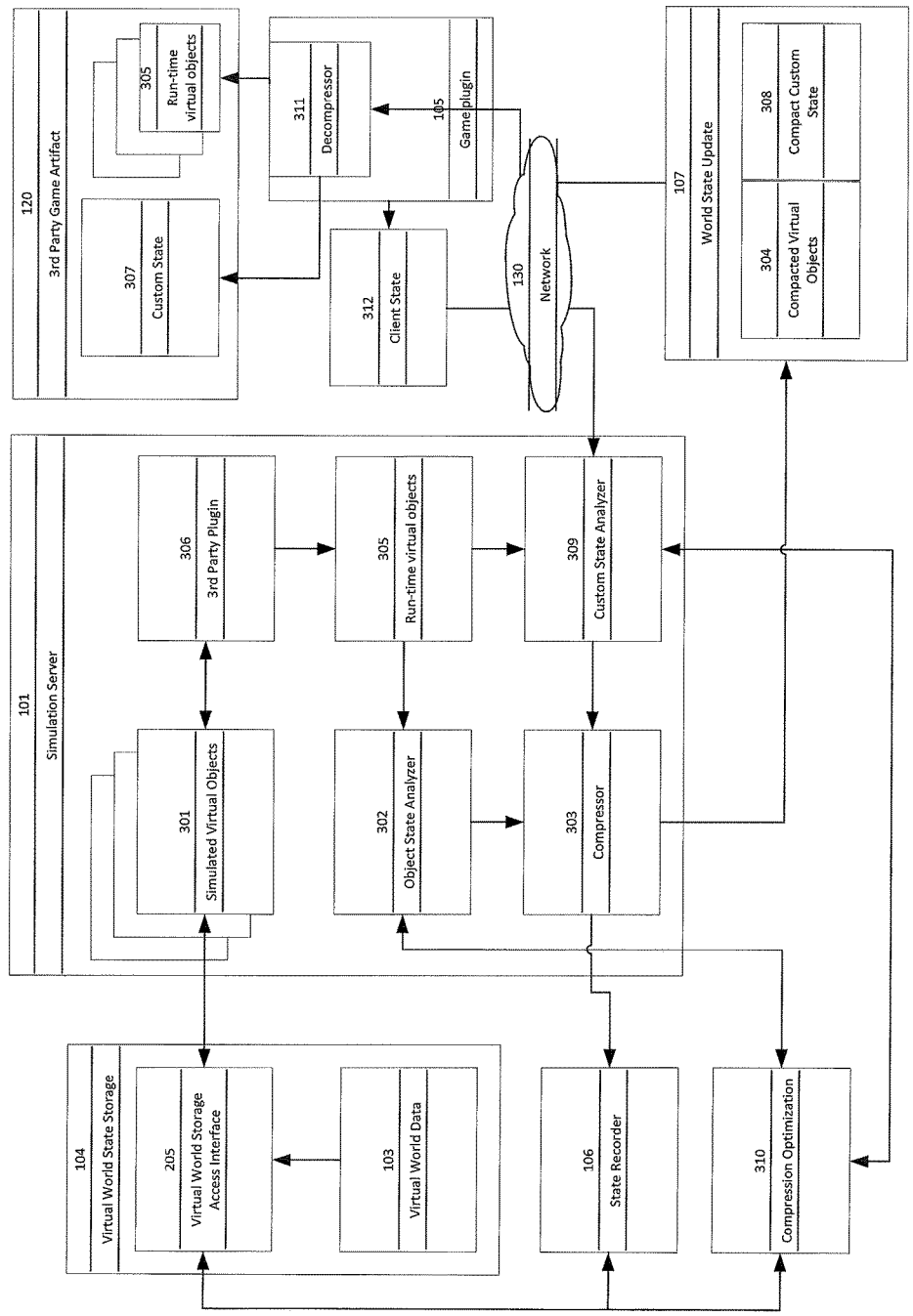
FIG. 10 schematically depicts how the gaming system functions at run-time.

FIG. 10 schematically depicts how the gaming system functions at run-time. State updates flow from the system 100 to the 3$^{rd}$ party game artifact 120. The simulation server 101 starts up and loads the initial simulation data from the virtual world storage access interface 205. The virtual world storage access interface provides the option to either load virtual world data 103, which contains all the initial conditions for the world as defined using the 3rd party editor 110, or to load simulation data from a previous state. Once the world simulation data is loaded, the simulation server 101 simulates world interactions in discrete time steps, called ticks. A 3$^{rd}$ party plugin 306 (within the simulation server 101) invokes simulation rules on each individual object of simulated virtual objects 301 in order to complete one tick. The world state is updated and stored as run-time virtual objects 305 which is directed into two systems. The first of the two systems is a custom state analyzer 309. This analyzer 309 uses client state data 312 received from all connected clients (or users) which contains relevant information such as camera position, view frustum, custom client data, and client input state (i.e. What keys are being pressed, mouse location, touch position on touchscreens, etc.). The custom state analyzer 309 and object state analyzer 302 also provide all associated metadata to compression optimization 310 such as data transform, context, and entropy information. The second of the two systems is the object state analyzer 302, which performs analysis on the run-time virtual objects 305 to determine the best method and context for compression. A compressor 303 provides the next stage of processing, processing metadata from the custom state analyzer 309, the object state analyzer 302, and the run-time virtual objects 305 to generate a world state update 107, which itself contains compact custom state data 308 which is generated from any client state 312, and compacted virtual objects 304 which is a compressed collection of the objects represented in the custom state 307. The world state update 107 is sent over the network 130 and is received by the game plugin 105, which uses a decompressor 311 to decompress the update back into run-time virtual objects 305 and custom state 307. The compressor 303 also sends a raw or minimally compressed version of the run-time virtual objects 305 to the state recorder 106 which makes use of virtual world state storage 104 to store each world update as a history. World history is available to the simulation server 101 to be replayed in an interactive (i.e. a game) or non-interactive (i.e. a recorded game or video) manner.

In the execution of the multiplayer gaming system, in order to improve or accelerate game play or to improve or accelerate the updating of the display that the user see, some of the data being transmitted may undergo compression to reduce the amount or size of network traffic required by the multiplayer game, and more specifically for a real-time multiplayer game. In one embodiment, this compression may occur within the simulation server, but may be performed elsewhere within the system.

In one embodiment, the method of compression or the disclosure may be used to assist in reducing the amount of data that is being transmitted between servers such that the reduced data allows for quicker transmission between these servers. The method of compression preferably allows for the compacting of fixed-sized binary data structures as will be discussed below.

Figure 1:
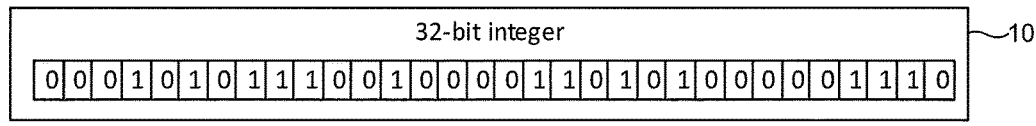
FIG. 1 is a diagram of a 32-bit integer fixed data structure.

In typical computer software data structures, fixed-size, or fixed-length, binary data structures may range from single bits to compositions of substructures of multiple bits. For example, in some software, applications may store a counter using a 32-bit integer structure. An example of a 32-bit integer structure 10 is shown with respect to FIG. 1. In other embodiments, the data, or integer, structures may be more complex and stored in larger composite data structures which may include floating point values, strings, or other composite values.

The current disclosure is directed at a method of compressing a set of fixed-size binary data structures. While only being described with respect to 32-bit integer structures, the method of the disclosure may also be used for other sized, typically larger, composite structures in order to improve transmission speed and time.

Figure 14:
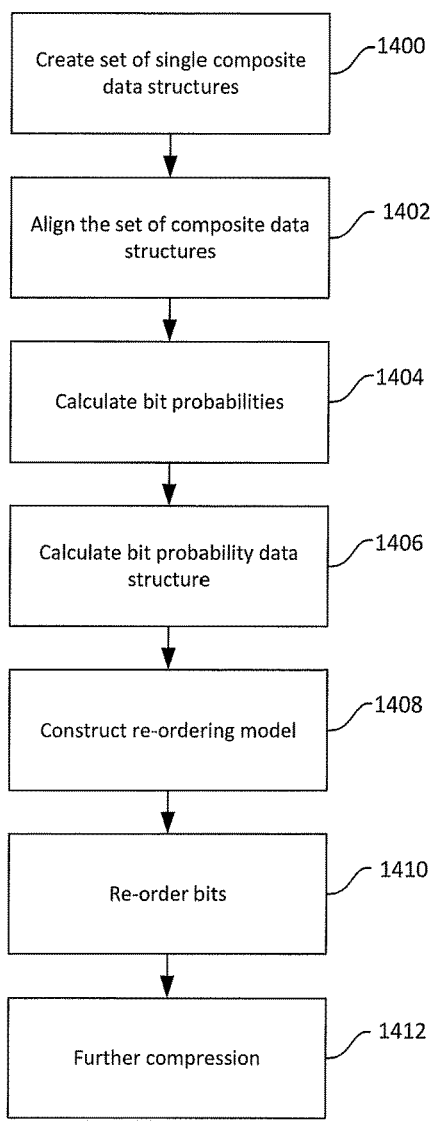
FIG. 14 is flowchart of a method of data compression.

Turning to FIG. 14, a flowchart outlining a method of data compression is shown. Initially, fixed-size binary data structures (such as the integer structure 10) are combined into a set of single composite data structures (1400). This is preferably performed by the compressor.

Figure 2:
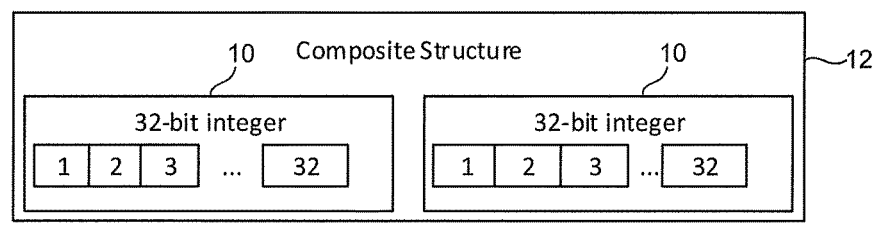
FIG. 2 is a two integer data composite structure.
Figure 3:
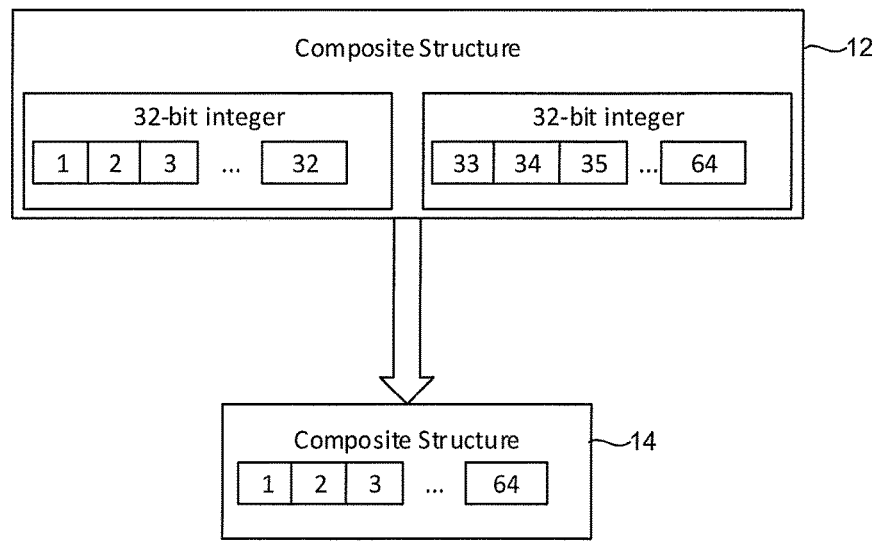
FIG. 3 is a data composite structure as define by the method of the disclosure.

Each of the single composite data structures includes a predetermined number of fixed-size binary data structures. For instance, consider a simple two-integer data structure 12 (as outlined in FIG. 2). In FIG. 2, the data structure 12 contains two 32-bit integer structures, or values, 10. For clarity of understanding, the bits are labeled with their positions within the respective integer structures 10. The integer structures 10 within the data structure 12 are combined and seen as the single composite data structure 14 (as schematically shown in FIG. 3). In the method of the disclosure, each single composite data structure 14 can be seen as a single bit-string. During normal gameplay (in the multi-player game), a set of single composite data structures 14 are regularly being transmitted. The set of single composite data structures being constructed by multiple data structures of two integer structures.

Current compression methods treat the set of composite data structures as a string of bytes and attempts to match a current substring with a previously encountered one in order to perform the compression.

In FIG. 3, each bit is labeled with its absolute position within the single composite data structure 14. As shown, the single composite data structure 14 represents a string of 64 consecutive bits which is the combination of the two integer structures 10 of FIG. 2.

Figure 4:
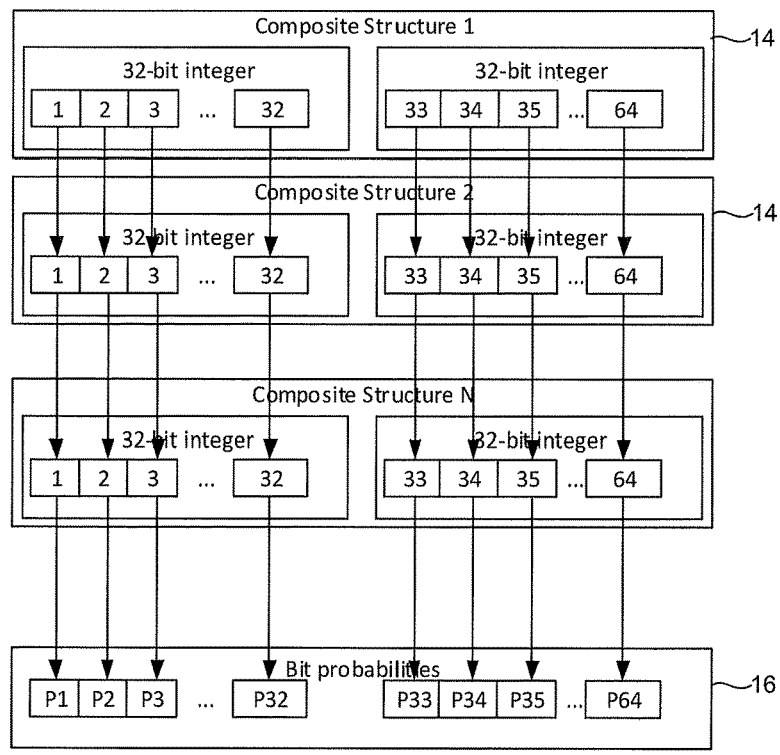
FIG. 4 is a schematic diagram of an alignment of data composite structures for the method of the disclosure.

The bits in each of the single composite structures are then aligned with each other (1402). As schematically shown in FIG. 4, the set of single composite data structures 14 are collected and then aligned with each other. The single composite data structures are considered to be aligned with each other bitwise when a first bit of a first single composite data structure or first single composite data structure instance is directly related to the first bit of all the other single composite data structures 14 in the set.

The bit probabilities (or the likelihood that that bit is set) is computed for each bit position within the single composite data structure 14 (1404). In one embodiment, the probability is calculated by traversing the aligned data structures in a column-wise manner. For instance, if there are 1000 data structures within the set of composite data structures, the number of 1s, or 0s, in the 1$^{st}$ position of the data structures over all the 1000 data structures is determined or counted. The total number is then divided by 1000 (or the number of data structures in the set) to determine the probability. This is then repeated for each position within the composite data structure. In the example of FIG. 4, this is 64.

These bit probabilities (P1, P2 . . . Pn . . . where n represents the bit position in the data structure 14) are then stored in a bit probability data structure 16 (1406). In the current example, the bit probability data structure includes 64 bit probability values.

Figure 5:
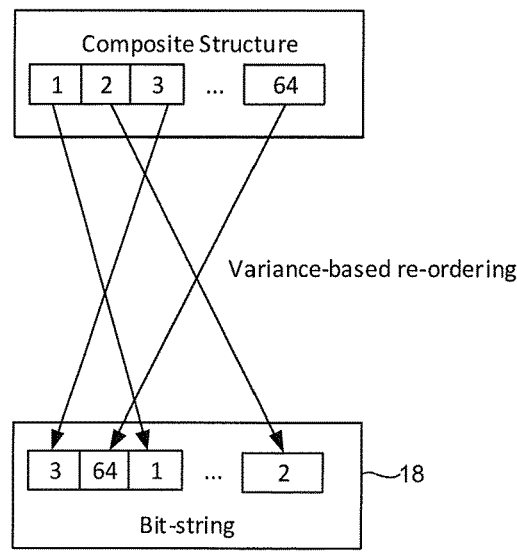
FIG. 5 is a schematic diagram of variance-based re-ordering for the data structure of FIG. 4.

The bit probability data structure 16 is then used to construct a re-ordering model (1408) or an intermediate buffer 18 (such as schematically shown in FIG. 5). The intermediate buffer may also be seen as a bit-string.

For a given probability Pn, it has a value Pn-Pn^2 that is directly proportional to the square of its variance. The re-ordering model is then constructed by sorting each probability Pn in increasing order. This results in the smallest variance occupying a leftmost (or most significant) bit position while the bit with the largest variance occupying a rightmost (or least significant) bit position. The remaining variances are then listed from smallest (leftmost) to largest (rightmost) within the intermediate buffer 18. This re-ordering model, or intermediate buffer, represents one embodiment of how to remap the bits from all the single composite data structures in the set of single composite data structures.

After the bits have been re-ordered, the compressor uses the mapping (created by the variance ordering) to re-order the bits (1410) from each single composite data structure 14 into an intermediate buffer 18 in a one-to-one relationship. In other words, the variance is computed and then the bit positions of each data composite structure are sorted based on the variance. These new positions become the mapping for compression. With these intermediate buffers in place, further compression of the data may then be performed (1412). This further compression of data may be performed in different ways as outlined below.

Figure 15:
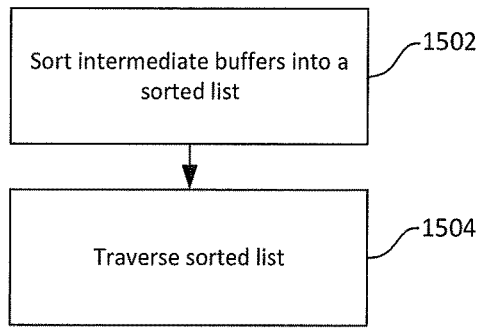
FIG. 15 is a flowchart of a method of further compression.

In one embodiment of further compression (as schematically shown in FIG. 15), the compressor treats each intermediate buffer 18 as a large integer (of 64 bits) or a bit-string. If the intermediate buffer contains 64 or fewer bits, the compressor can use a native 64-bit (or smaller) integer type, and, if not, the compressor can treat the string of bits as an arbitrarily long integer type. The compressor then sorts the resulting integers (1502) (as determined by the above-described mapping of the intermediate buffers 18), preferably in ascending order. Being able to uniquely identify each object instance is beneficial to the further compression. Identification (ID) information is present in many data structure implementations, but in those cases where the ID information is not a field within the structure, then the order of the structure in the list is important. A user of the compression system of the disclosure provides this information such that the compression system can then automatically include the original index with each object instance as an additional field prior to performing bit calculations.

The compressor then traverses the sorted list (1504), looking at adjacent intermediate buffer pairs.

Figure 6:
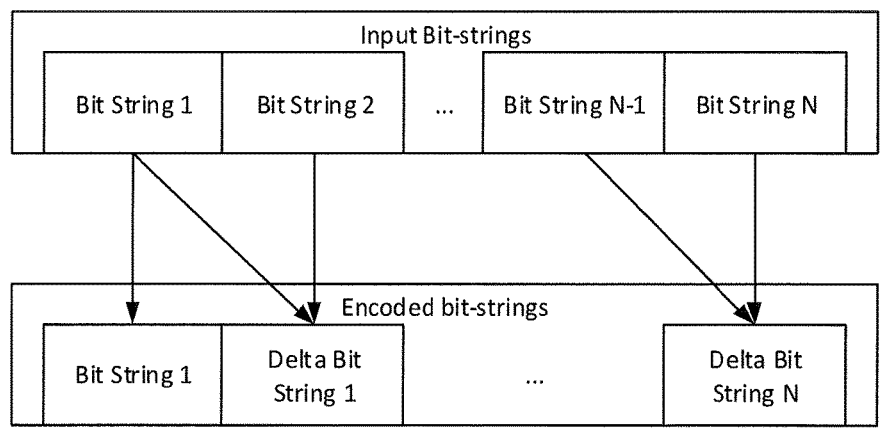
FIG. 6 is a schematic diagram of encoded bit-strings.
Figure 16:
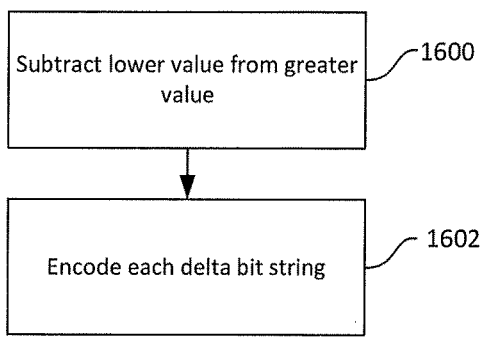
FIG. 16 is a flowchart of a first embodiment of traversing a sorted list.

In one example of traversing the sorted list (such as schematically shown in FIG. 16), the processor subtracts the lower value from the greater value (1600), which generates a delta value. It continues this process until each bit string within the ste of intermediate buffers of bit strings has been converted into a delta (save for the first) (as schematically shown in FIG. 6). In other words, if there are N (where N represents the number of intermediate buffers being compressed), after the intermediate buffers are sorted by value, intermediate buffer 1 is subtracted from intermediate buffer 2 to provide encoded delta bit string 20 for Delta Bit String 1. This continues until delta bit strings are calculated up to and including for the N-1 bit string. For instance, if there are initially 1000 composite data structures, 1000 intermediate buffers are determined. After sorting the intermediate buffers, such as disclosed above, the first intermediate buffer is subtracted from the second intermediate buffer to determine delta bit string 1. The second intermediate buffer is subtracted from the third intermediate buffer to determine delta bit string 2. This continues until the $999^{th}$ intermediate buffer is subtracted from the $1000^{th}$ intermediate buffer.

The compressor may then encode each delta bit string to an output (1602) by adding a small header denoting the number of bits each delta requires for storage. The bits are counted from the first, or most significant set bit in each delta such that all leading zero-bits are not explicitly encoded and can be inferred this way. The encoding also encodes the starting bit buffer (Bit String 1 of the encoded bit strings) as a non-delta so that all other bit buffers can be recomputed from it by the decompressor.

Figure 17:
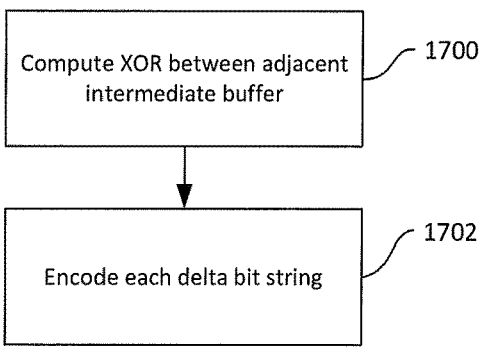
FIG. 17 is a flowchart of a second embodiment of traversing a sorted list.

In a second method of traversing the sorted list (as schematically shown in FIG. 17), instead of subtracting adjacent values, the compressor computes a bitwise XOR between the adjacent bit strings or intermediate buffers (1700) to determine or calculate a delta. After determining the delta for each of the adjacent bit string pairs, the compressor encodes each delta (1702) to include a header to include a number of bits required for storage and to encode the starting intermediate buffer such as disclosed above. The decompressor can then re-compute the compressed data using the encoded bit strings.

In each of the embodiments disclosed above, an output (seen as an encoded bit-string) is generated where each encoded bit-string is encoded as a series of bit strings preceded by short headers such as shown as schematically shown in FIG. 6. The encoded bit-string may include additional metadata such as, but not limited to, bit header lengths, models, and compression method used.

Figure 7A:
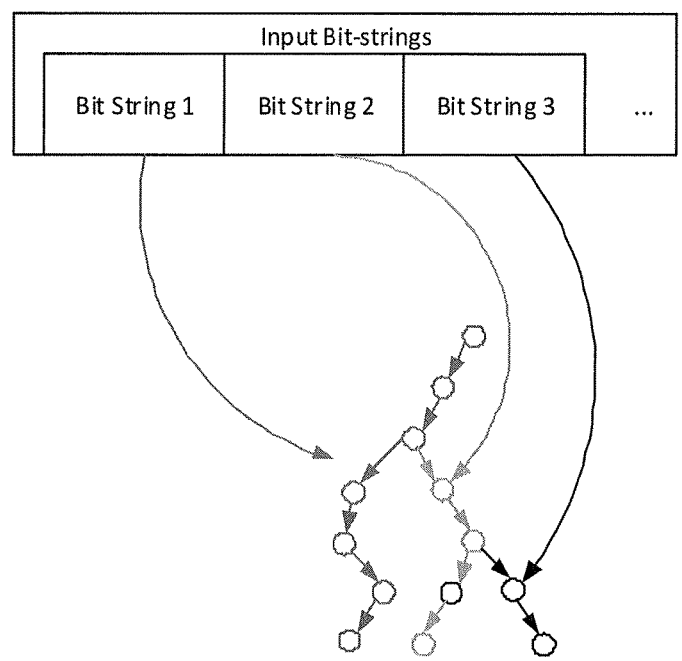
FIGS. 7a and 7b are schematic diagrams of another embodiment of compression.
Figure 7B:
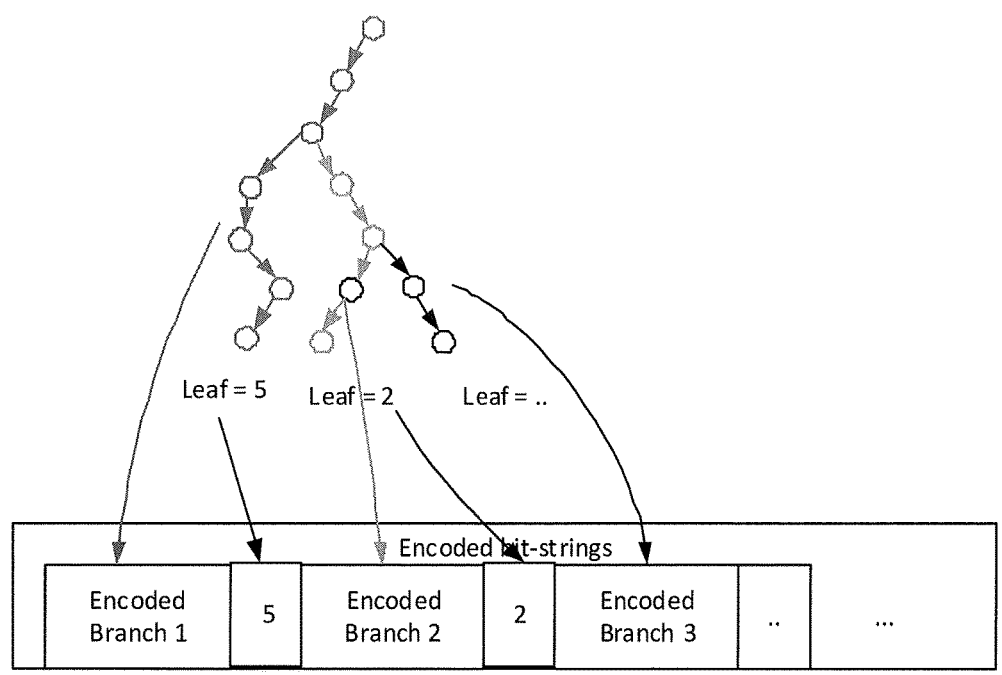
Figure 18:
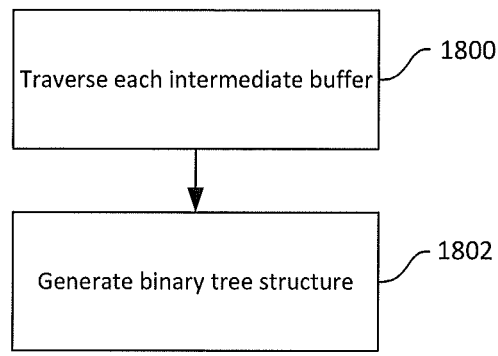
FIG. 18 is a flowchart of a third embodiment of traversing a sorted list.

In a further embodiment of traversing the sorted list (as schematically shown in FIGS. 7a, 7b and 18), each intermediate buffer is traversed bit-wise from most significant bit to least significant bit (1800). These bits are then used to generate paths and branches in a binary tree structure (1802) (such as schematically shown in FIG. 7a). As the bit strings are inserted into the binary tree, their common bit values form shared branches.

While each of the intermediate buffers are being traversed, the compressor generates (or will have generated based on the intermediate buffer traversal), a fixed-depth binary tree. At each leaf of the binary tree, the compressor encodes the location of the last branching point as branching point data. The compressor then encodes the branching point data by dumping the tree into a known order, such as left to right or right to left. Each time the encoder encodes down to a leaf, it removes the encoded most branch from the tree and then follows the value encoded at the leaf back to the last branch, and repeats the process. Each time it steps back to the most recent branch, it reduces or minimizes the additional data it has to encode for the new data structure. An example of this traversal is shown in FIG. 7b. After the compression has been performed, an output is created which will can then be decompressed after transmission.

Figure 13:
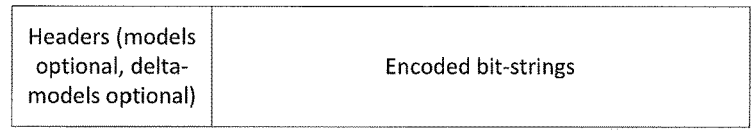
FIG. 13 is a schematic diagram of an encoded bit string.

In another embodiment, the model can be supplied over a different channel. For example, a model can be generated from a large set of data and stored in the decompressor. The compressor then uses this model to compress input data, but does not need to encode the model in the output. This typically results in somewhat less-optimal compression, but may still generate a smaller compressed output because the model no longer has to be encoded with the output. A schematic diagram is shown in FIG. 13.

In this manner, the bit re-ordering can be computed one time on a sample set of data (for instance the first several objects—or bit-strings), and then that mapping may be re-used in subsequent encodings such that there is no need to encode the mapping with the objects every time In a further embodiment of compression, which may be integrated with any of the methods outlined above or may be performed as a stand-alone compression function, the compression method may be an entropy-based compression method. In one embodiment, the entropy-based compression may be applied as additional computation work against the output of any of the above methods of compression to further reduce the size of the data being compressed. In a further embodiment, the entropy-based compression may be integrated with one of the above compression methods to enhance compression performance. Alternatively, the entropy-based compression may be used as a general-purpose compressor on byte streams.

In this entropy-based embodiment, the compression method operates on bit-strings. The method involves determining bit ordering from a source; transforming the resulting bit-strings; and placing the resulting bit-strings through multi-model entropy compression that reduces the size of the output of the transformation.

Figure 19:
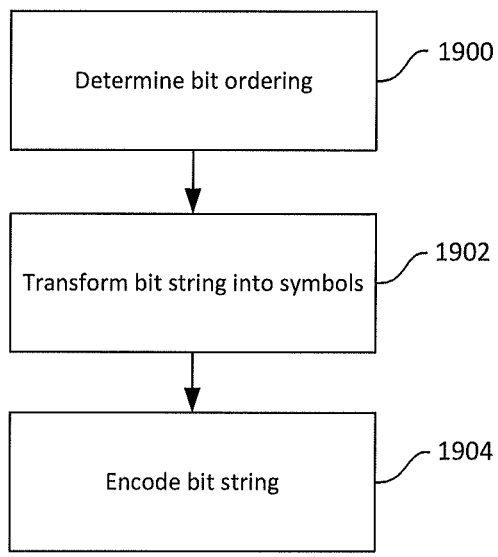
FIG. 19 is a flowchart of an embodiment of entropy-based compression.

Turning to FIG. 19, a flowchart outlining an embodiment of entropy-based compression is shown. Firstly, the bit ordering is determined (1900). Input data is initially interpreted as a sequential string of bits. There are two ways to interpret these string bits.

The first is to start at the beginning of the data and traverse it one bit at a time until the end. For example, the following five (5) bytes of input data may be represented as a bit string with spaces denoting byte boundaries. In other words, the 5 bytes of data may be seen as 5 fixed-data strings.

10001011 10111010 11101110 11001010 10011001

A second way to interpret the data is to consider the data as a list of fixed-sized structures. Using the input data from the example above, the input data can be seen as an 8-bit fixed size structure. The bits can be aligned to represent common information by looking at the bits as columns where the rows are the instances of the 8-bit fixed-data structure:

|  |
| --- |
| 10001011 |
| 10111010 |
| 11101110 |
| 11001010 |
| 10011001 |

As the 8-bits of each data structure form columns, the columns can be interpreted as containing common information and the bits transposed to generate a column-wise interpretation. The columns (starting from left to right) become:

|  |
| --- |
| 11111 |
| 00110 |
| 01100 |
| 01001 |
| 00100 |
| 11110 |
| 10001 |

Column aligned interpretations of bit streams allow an option of compressing bits that are related to each other. As can be seen above, there are two columns that have more instances of 1s than 0s. This relation is not apparent in the first method of bit interpretation. Performing the bit interpretation using the second method allows for different columns to be encoded using different statistical models.

To determine which method of bit-interpretation may be preferred, predicted compression ratios may be observed or reviewed. With structured data, it is more likely that there are columns that rarely or never change state. In those cases, the input data can be encoded differently—as an entropy coder for the row of all 1 values may not be needed. Instead, the column number and the value is just encoded.

After the input data has been interpreted, the bit-strings are to be transformed in order to convert the bit-strings into symbols (1902). The symbols may represent numbers that denote the lengths of the bit-strings. Different methods of transforming the bits are considered.

In one method of bit-string transformation, which may be seen as a bit state length embodiment, a run of bits in a single state (0 or 1) are considered to be a complete string. This complete string may be represented as a number. For example, a series of 1's in a row, such as 11111, can be represented as 5. A new string is defined each time there is a bit change state. 000111 is viewed as 2 strings, each of length 3. Consider a series of input bits such as 10011101011110010000001110101101001010101110111- 1110001101010111

This may be converted, or transformed, into a series of symbols:

1 2 3 1 1 1 5 2 1 6 3 1 1 1 2 1 1 2 1 1 1 1 1 1 2 1 6 3 2 1 1 1 1 1 3

Therefore, the transform yields a series of numbers {1, 2, 3, 1, 1, 1, 5, 2, 1, 6, 3, 1, 1, 1, 2, 1, 1, 2, 1, 1, 1, 1, 1, 1, 2, 1, 6, 3, 2, 1, 1, 1, 1, 1, 3}, which can be further processed and compressed.

In another embodiment of bit-string transformation, which may be seen as a zero-terminated bit-string embodiment, the bit strings can be interpreted and converted into a series of lengths. This variant of the transform looks for strings of 1's and considers the first 0 bit the termination. Therefore, when considering a series of bits, such as 11001110, it may be broken up as {110, 0, 1110}. The lengths may be counted as {3, 1, 4}. In the event that the input bit-string is all 1's, or that don't terminate in a 0, a final trailing 0 is considered to be implicit. To reduce or prevent data corruption, any final encoded output should preferably include the number of bits encoded so that a decoder does not produce the implicit trailing 0 in its output.

Another caveat is that input bits such as 0000000000 . . . 0 encode as a longer series of {1,1,1 . . . 1}, whereas inputs such as 1111111111 . . . 1 encode to a single value. Normally this wouldn't be a problem, as these cases are easily detected and can be encoded using alternate methods.

In a further embodiment of bit-string transformation, which may be seen as a one-terminated bit-string embodiment, this transform is exactly like the zero-terminated bit-string embodiment, except that it looks for a run of 0 bits terminated by a 1 bit. So the string 11001110 encodes as {1, 1, 3, 1, 1, 1}. Similar issues that arise with respect to the zero-terminated embodiment exist with the one-terminated embodiment for opposite state bits.

After the bit-strings are transformed, they are then encoded (1904). With the series of numbers created, there is a desire to encode them efficiently. Several ways to encode the transformed bit-strings are considered.

In one embodiment, which may be seen as a naïve embodiment, a naïve application of a standard arithmetic encoder is used. As this encoder can encode fractional bits, if the data set contains a large number of 1-lengths, the encoder may encode to a single bit or less (though sometimes more). This naïve form of compression uses a single context, or probabilistic model, which may be seen as the 'main context'.

In another embodiment of encoding the bit-strings, which may be seen as a run-lengths embodiment, the overall method of compression may be improved by adding in a concept of run-length encoding. When a bit-wise compressor is being used, a special symbol in the arithmetic encoders model is used to denote a run. Consider the following example: {1,3,4,1,5,1,1,1,5,3,1,1,4,5,5,1,1,2,3,4,1,4,4,2,1,5, 6,6,1,3,3,3,1,1,1,1,1}

As can be seen, there are several repeat sequences. If a run length is defined as a symbol "R", followed by the value to repeat 'v', followed by the repeat count 'n' (R{v, n}), these parameters of R are each compressed using respective encoding contexts, bringing the context count up to 3. Each time the encoder encodes "R", it switches to a context containing the model for repeated symbols. After it encodes the symbol, it switches again to a context containing repeat counts to encode the count, at which point it switches back to the main context.

Using this methodology, the above number string is converted to:
1, 3, 4, 1, 5, R{1, 3}, 5, 3, R{1,2}, 4, R{5,2}, R{1,2}, 2, 3, 4, 1, R{4,2}, 2, 1, 5, R{6,2}, 1, R{3,3}, R{1,5}

As can be seen, the run-lengths occur frequently. Therefore, if the probabilistic model for the above is considered, the run-length encoding contexts (each containing an entropy model) for above data are computed as (bits per symbol is the standard entropy calculation which can be seen as: $-\log_2(\text{count/total})$):

| symbol | count | bits per symbol |
|---|---|---|
| Main context | | |
| 1 | 5 | 2.263034406 |
| 2 | 2 | 3.584962501 |
| 3 | 3 | 3 |
| 4 | 3 | 3 |
| 5 | 3 | 3 |
| R | 8 | 1.584962501 |
| v context | | |
| 1 | 4 | 1 |
| 3 | 1 | 3 |
| 4 | 1 | 3 |
| 5 | 1 | 3 |
| 6 | 1 | 3 |
| n context | | |
| 2 | 5 | 0.678071905 |
| 3 | 2 | 2 |
| 5 | 1 | 3 |

The original data is 94 bits long, the encoded data is less than 85 bits long.

Note that in some cases, such as R{1,2}, it might not make sense to use a run-length. In this example it can be seen that two 1's encode to less than 4.52 bits, whereas R{1,2} encodes to over 4.58 bits. This is mitigated by computing a total size of the R{v, n} statement and comparing it to simply encoding the values using the main context.

An alternative encoding embodiment, which may be seen as a run-of-ones embodiment, would be to run-length encode repeated values of 1 only. In this case, the extra 'v' context is not needed, and every "R" symbol is followed by the count of 1's. This may provide improved compression while also being faster to encode/decode. A simple example of applying the Runs of One transform is shown below.

{2, 3, 1, 1, 1, 3, 5, 7, 2, 1, 1, 2, 7, 4, 1, 1, 1, 1, 3, 4, 4, 4}
{2, 3, R{3}, 3, 5, 7, 2, R{2}, 2, 7, 4, R{4}, 3, 4, 4, 4}

In yet another embodiment of encoding, which may be seen as a pattern matching embodiment, a more sophisticated encoder may use pattern matching in a manner similar to Lempel-ziv/Lempel-ziv-markov class of encoders (LZ*, LZM*). Instead of using a special code "R" to denote a run length, a special code "P" to may be used to denote a pattern. The pattern code is followed by an offset 'o' that represents how many symbols to look back, followed by a length 'l', which represents the number of subsequent symbols is used to construct this pattern (P{o, l}).

Consider the following example:

{1, 2, 3, 1, 1, 2, 3, 4, 2, 2, 1, 1, 1, 1, 3, 5, 4, 3, 2, 1}

Patterns may be determined such as listed beneath the example

{1, 2, 3, 1, 1, 2, 3, 4, 2, 2, 1, 1, 1, 1, 3, 5, 4, 3, 2, 1}
{1, 2, 3, 1, P{4, 3}, 4, 2, 2, P{7, 2}, P{1, 2}, 3, 5, 4, P{9, 2}

From this data, the models for the 3 contexts can be generated:

| Symbol | Count | Bits Per |
|---|---|---|
| Main context | | |
| 1 | 2 | 2.807355 |
| 2 | 3 | 2.222392 |
| 3 | 2 | 2.807355 |
| 4 | 2 | 2.807355 |
| 5 | 1 | 3.807355 |
| P | 4 | 1.807355 |
| "o" context | | |
| 1 | 1 | 0.60206 |
| 4 | 1 | 0.60206 |
| 7 | 1 | 0.60206 |
| 9 | 1 | 0.60206 |
| "l" context | | |
| 3 | 1 | 0.60206 |
| 2 | 3 | 0.124939 |

In this example 43 bits of input data compresses to less than 38 bits of output data.

It is possible to combine all the methods outlined above with respect to encoding into a single algorithm, however more logic may be required during compression in order to select which technique or embodiment to use. This may result in overall improved compression.

Additional efficiency is gained when rules for modifying the models in each context while encoding or decoding are followed. This technique is well-known, and results in improved compression performance and may be seen as adaptive encoding and decoding.

Models are created before the data is encoded by generating and counting the symbols. Once all symbols are counted, they may be encoded one at a time by the arithmetic/range-coder. As a particular symbol is encoded, it is removed from the count of the applicable model.

The decoder follows the same rules. It uses the same models as the encoder, and as it decodes a particular symbol, it decrements the count of that symbol from the applicable model using the same rules as the encoder.

Additional metadata such as the number of header bits per encoded delta may also be stored. In some cases the repeated headers may be encoded, such as the bit string headers, using an arithmetic or range coder to reduce the overhead. If an arithmetic or range coder is used, those models may also be included in the header, may be static, or they may be corrections to a previously shared model (such as a delta-model).

In general, after the data has been compressed, the data is to be decompressed. Embodiments of decompression for use with the methods of compression disclosed above are now described. The decompressor, after parsing any metadata from the output stream (an optional model and additional headers), then inverses the steps performed by the compressor. The decompressor preferably includes a decoder which assists in decoding the encoded bit strings.

The decompressor firstly decodes the non-delta first bit buffer (or Bit String buffer from FIG. 6) and then decodes the subsequent delta bit buffer. The encoded intermediate buffers are then converted to integers, and the decompressor adds (if compressed by subtraction) or uses bitwise XOR (if compressed with the bitwise XOR) the second encoded bit string (or decoded delta) to the first bit string. It then takes the newly decoded intermediate buffer, cast as an integer, and uses it in the same way to decode the third value, and so on until all the entire data structure has been decoded or decompressed.

If the binary tree structure has been used to traverse the sorted list, the decoder, or decompressor, decodes the first value as the left or rightmost branch of a binary tree. As the metadata encodes the depth of the tree, the decoder automatically knows when it reaches the leaf. Once it decodes the branch, it decodes the leaf which contains the distance back up the tree to the top of the next encoded branch. The decoder decodes the next set of bits as the next branch until once again it has decoded to the depth of the tree, where decodes the next leaf, and repeats this process until it has decoded the entire tree. The data may then be seen as decompressed.

Figure 11A:
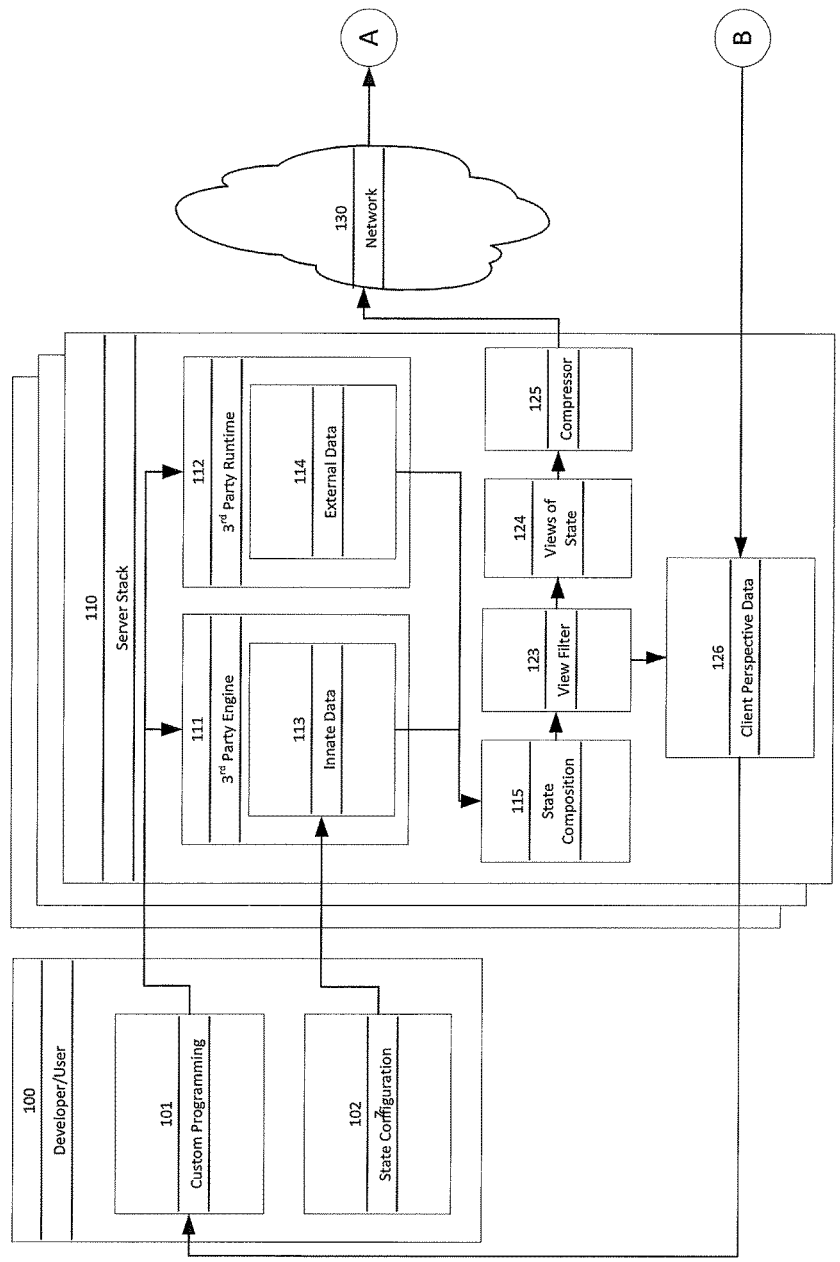
FIGS. 11a and 11b are schematic diagrams of an embodiment of a system for compression.
Figure 11B:
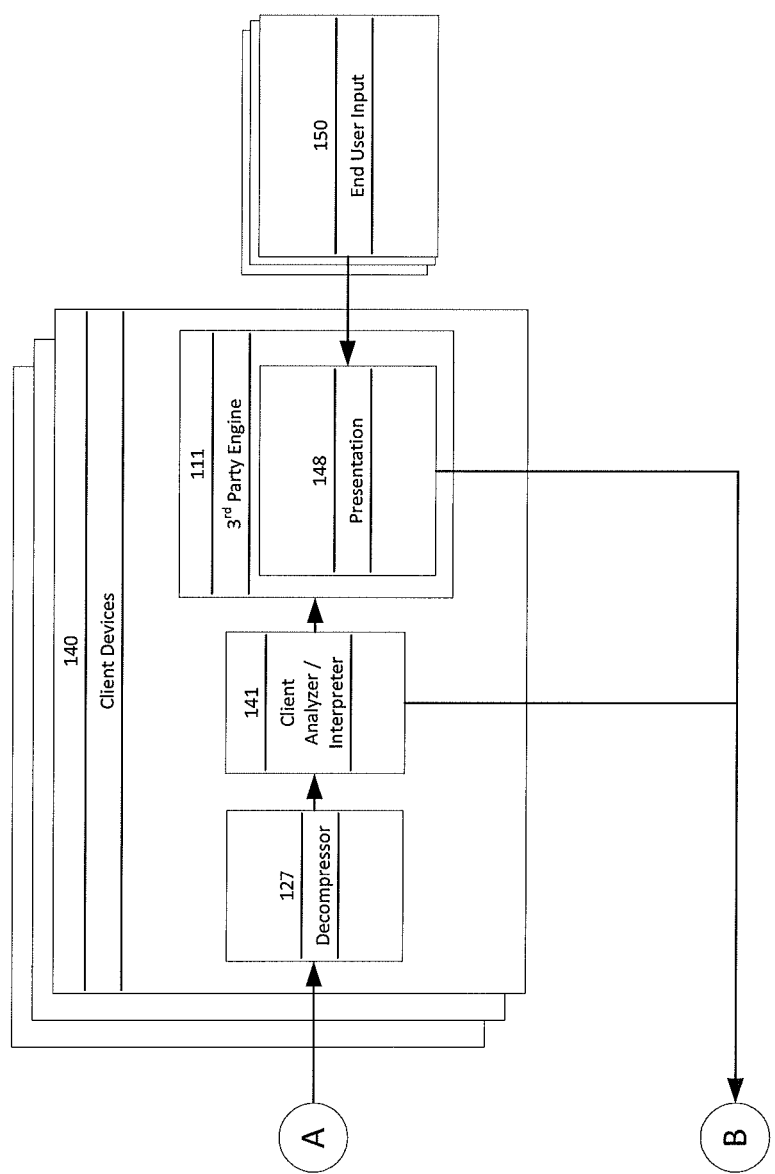

FIGS. 11a and 11b are schematic diagrams of another environment within which a method of compression may be executed.

In the system 1000 of FIGS. 11a and 11b, a developer, or user, provides custom programming language 1101 and state configuration information or data 1102 to develop or customize at least one server stack 1110. The server stack 1110 includes a $3^{rd}$ party engine 1111 (such as a $3^{rd}$ party physics simulation library) and a $3^{rd}$ party runtime module 1112. The $3^{rd}$ party runtime module which compiles the custom programming data 1101. The developer 1100 can also define a set of external data 1114 that is managed and modified by the $3^{rd}$ party runtime module 1112. Innate data 1113 is also provided to the server stack 1110 by the developer in the form of the state configuration data 1102.

The innate data 1113 and the external data 1114 are provided to a state composition module 1114 which connects with a view filter 1123 which, in turn, provides client perspective data 1126 or view of the state 1124. The client perspective data 1126 can be returned to the developer to assist in the custom programming data 1101. The view of the state 1124 is connected to a compressor 1130 that then transmits the data to client devices 1140 via a network 1130. The client devices 1140 include a decompressor 1127, a client analyzer/interpreter 1141 and a $3^{rd}$ party engine 1111 which includes a presentation engine 1148. Both the client analyzer/interpreter 1141 and the $3^{rd}$ party engine 1111 return data or information to the client perspective data module 1126 within the server stack 1110. The client device 1140 may also be accessed by end users in the form of end user input 1150.

The server may require a plug-in library to be embedded within an application running on all connected 1140.

In one embodiment, the $3^{rd}$ party engine 1111 may be integrated into the system behind the decompressor 1127. The decompressor 1127 is designed to cover all aspects of interacting with both 2D and 3D physics engine libraries. The decompressor 1127 further acts on and can mutate a collection of objects that each contain innate data 1113, which is comprised of positional information as well as physics characteristics such as mass, static/kinetic friction, angular damping, shape, scale, constraints, angular and linear acceleration, angular and linear velocity, etc.

The $3^{rd}$ party runtime module 1112 is a secondary set of processes that can further mutate the innate data 1113 and augment it with the external data 1114. The server stack 1110 executes the simulation by computing discrete time steps in sequence.

Figure 12:
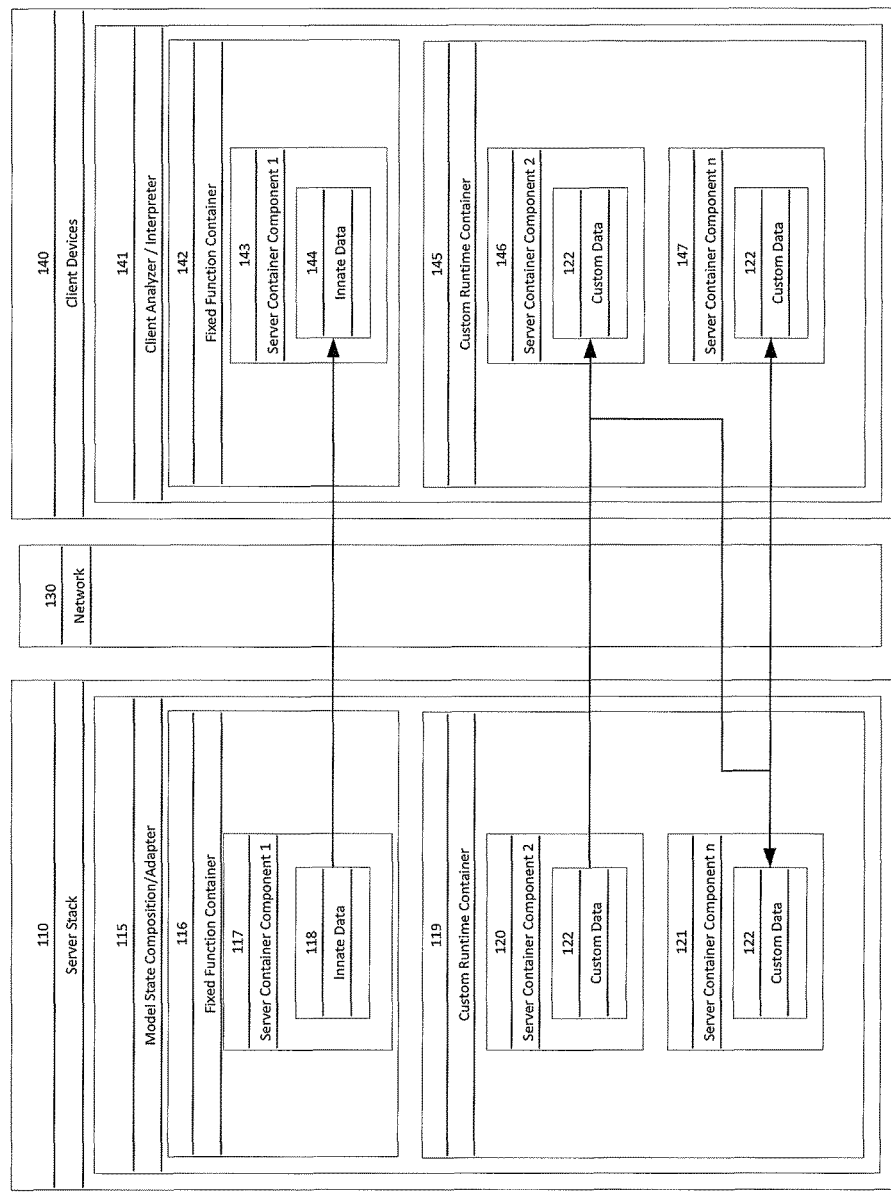
FIG. 12 is a schematic diagram of another embodiment of a system for compression.

Turning to FIG. 12, a schematic diagram of a server stack 1110 communicating with at least one client device 1140 is shown. The server stack 1110 communicates with the at least one client device 1140 over the network 1130.

The server stack 1110 includes a model state composition/adapter 1115 which, itself, includes a fixed function container 1116 and a custom runtime container 1119. A set of server container components are stored within the two containers 1116 and 1119. These server container components are user or developer-defined containers of data. These containers of data may contain data game-specific data such as player score, player items, gameplay actions, etc. to assist in gameplay. The fixed function container 1116 includes a first server container component 1117 storing innate data 1118 while the custom runtime container 1119 includes the remainder of the set of custom runtime server container components seen as server container component two 1120 to server container component n 1121. The server container components within the custom runtime container 1119 each include custom data.

The client device 1140 includes a client analyzer/interpreter 1141 which includes a fixed function container 1142 with a server container component 1143 (including innate data 1144) which corresponds with the server container component 1117. The client device further includes a custom runtime container 1145 which includes server container components 1146 which correspond in one-to-one relationship with the server container components of the custom runtime containers in the server stack 1110.

One example use of the method of the disclosure may be in Fast Floating Point Data Preconditioning.

Single-precision floating point data (IEEE754) is a specific type of data structure that uses 32 bits to store 3 values: 1 bit is used to store sign information, 8 bits are used to store an exponent (applied to a base of 2), and the remaining 23 bits store a mantissa. The number represented by the floating point value is then <sign>1. <mantissa>x2$^{exponent}$. When compressing floating point values, there is a desire to have as few bits in the data structure vary as possible.

The first step is to reduce or eliminate variability in the exponent bits. To do this, it is determined if the set of values being compressed have absolute values that can be spread over a range, for example a set of values {17, 29, 27.7, 30.322} all fall between 16 and 32 and exist within the spread of $2^4$ (16). It should be noted that most values aren't this conveniently structured. Consider the set {5.5, −1.3, 4.1, −7.2}. The absolute values of this set are spread between 3 different powers of 2 ($2^1$, $2^2$, and $2^3$). Because of this, the floating point data structures will have different values in their exponents and mantissas.

If a high (or maximum) absolute value and a low (or minimum) absolute value are obtained, the entire range can fit within as power=Ceil($\log_2$(MAX−MIN)). A value for $2^{power}$ is calculated and then added to all positive values in the set, and subtracted from all the negative values in the set. For example, as the set {5.5, −1.3, 4.1, −7.2} spans a range of $2^3$=8, so we add (or subtract) 8 to generate the new set {13.5, −9.3, 12.1, −15.2}. These new floating point numbers all share a common exponent. Since the exponents bits have zero variance the compressor will automatically only encode the required bits once.

Sign information is to be preserved, so nothing is done with the sign bit. Mantissa information can be adjusted further depending on the precision required. The bits of the mantissa represent fractions ½$^n$ where n is the position of the bit in the mantissa, therefore the first bit represents ½, the next bit represents ¼, and so on. The mantissa behaves like a fixed point integer that represents a ratio normalized to the range of values possible at a given exponent. Because the mantissa is 23 bits in length, it is accurate to 1 part in 8 million. Often much less precision is required, such as with rotations, where 1 part in 1000 is often enough. To reduce the mantissa to an applicable precision, an appropriate number of the least significant bits is masked off. For 1 in 1000 accuracy, the 10 most significant of the 23 bits are retained. Masked off bits are set to 0, and have 0 variance, so the compressor can remove them from being encoded.

When truncating bits off of the mantissa, special attention is paid to rounding. The act of truncation can remove a non-trivial amount of detail information. For example, 1.599 and 1.501 when masked to beyond the 10$^{th}$ will change both values to 1.500. It becomes important that rounding is performed before masking. If two IEEE754 mantissas are selected, say 1.0110$_b$ (1.3725), and they are truncated to two bits, a review of the third bit (0.001$_b$) is required, as it represents a value of exactly half of the least-significant bit of the final value. If the third bit is set, the value is rounded up by adding it to a target just before masking: Therefore 1.0110$_b$+0.001$_b$=1.100$_b$ (1.5). A mask is then applied to 1.100$_b$ to get 1.10$_b$. There is a limitation with mantissa math where each bit represents a fraction (½$^n$) where n is the position of the bit. This makes it somewhat more difficult for a developer to determine error tolerance as developers think in decimal but masking bits off of a mantissa creates error values that are ½$^n$ (ie. for increasing n the error values of each bit position are 0.5, 0.25, 0.125, 0.0625, 0.03125, 0.015625, 0.0078125, 0.00390625, etc). This makes error prediction unintuitive.

An alternative method is to renormalize the mantissa. In order to normalize a mantissa to a given number of bits B, the mantissa is multiplied it by $2^B$. For example, if it is desired that B=16 (hence to normalize the mantissa to 16 bits), the mantissa is multiplied by $2^{16}$. The normalization is performed by dividing the product by $2^{23}$ (for a 23-bit mantissa).

Recovering the mantissa inverts the operation. The value is multiplied by $2^{23}$, then divide by $2^{16}$. A faster approach is available, but may not always produce exactly the same result since it doesn't perform any rounding. This approach may be seen as multiply the value by $2^{(N-M)}$. This, however, will work no differently than left or right shift by (N−M) bits, which in turn is no different than the masking technique above.

The offset information is then transmitted to the decoding side or decompressor so that it can be used to reconstitute the desired data. The offset can be sent as a floating point value, but would be much more compact if limited to just the integer exponent for the power-of-2 offset.

Facing data is sent using normalized quaternions encoded using the common smallest-3 technique which encodes 3 of the 4 quaternion values, and the sign bit of the 4$^{th}$. Quaternion components are floating point values in the range of −1 . . . 1. Using a modification of the technique above, an offset of 2 is used instead of 1, resulting in a shift of values to the range of −3 . . . −2, 2 . . . 3. As above, mantissas are quantized, but are quantized 1-bit less aggressively (ie, use 11 bits for 1 in 1000 precision instead of 10) because all the values are spread over only half of the range of 2 . . . 4.

Another example where compression may be beneficial is within game data streaming. Game data for many games involves transferring world state from the server to the client. The bulk of the data in the world state is an identification (ID), position, and rotation information for objects in that world.

Consider a three-dimensional (3D) shooter type game. Players control virtual avatars that walk or run around an arena including platforms, ramps, hallways, and open areas. Each avatar is described by an ID number, a position in cartesian coordinates, and a facing value encoded as a normalized quaternion. Position and rotation together are part of the avatar transform.

Players join the game by executing a game client, which connects to a common server (or authoritative game client). The server executes the game simulation. The game client receives input from the player and send the commands to the server, which then chooses which commands are executed, and applies valid inputs to the game simulation.

The server has a network stack to which the simulation data are rendered. In this particular example, player inputs result in avatar motions in the virtual world, varying the transforms of each as they move about the level. The server encodes the world state to a network packet several times per second, and sends the resulting packets to all the game clients. The process of encoding the packet involves sweeping all the objects in the simulation (avatars and other objects, such as items, or artificial intelligence (AI) controlled entities), and serializing each one's respective transform into a buffer. This buffer is written into one or more packets, and is then sent to the connected game clients using a network protocol such as UDP or TCP.

Compression can be applied to the data so that it minimizes the number of packets required to be sent. In a preferred embodiment, the compression method of the disclosure is used for this compression. At the end of a simulation step, the server iterates through all the objects in the simulation. It selects those that are to be serialized. For each avatar, it will serialize the ID and the transform information. For other game objects, it may serialize the transform data, or it may serialize some other associated data. For example, there may be item objects in the level that don't have changing transforms—the connected game clients already know their locations. These item objects may have other data that can be serialized instead such as a quantity of points or virtual currency, or perhaps a visibility value if the item is collectible.

If objects with transforms are considered, the compression takes place just before the packets are constructed. Each avatar's transform is preconditioned using the technique described above. The level of quantization is chosen based on how much precision is required for the game clients to accurately recreate. If the level is 100×100 meters, and position accuracy to 1 cm is required, the position portions can be quantized to $\frac{1}{10000}$th, which can be represented using 14 bits of mantissa precision. Facing values can be similarly quantized. The quantization process involves copying the transform and ID data to a new structure where the quantization takes place. When this process is complete, a list of quantized transforms that can be processed by the compression system described above is created.

The result of the compression yields a series of large integer types that are encoded into one or more packets as consecutive bit strings, each with associated metadata describing their respective lengths. The remapping data may be encoded first, if the clients don't already have it, at the cost of additional packet payload size. The packets are then sent over the network to the connected clients, and the server proceeds to compute the next simulation step(s) before repeating the process.

In the preceding description, for purposes of explanation, numerous details are set forth in order to provide a thorough understanding of the embodiments. However, it will be apparent to one skilled in the art that these specific details may not be required. In other instances, well-known structures may be shown in block diagram form in order not to obscure the understanding. For example, specific details are not provided as to whether elements of the embodiments described herein are implemented as a software routine, hardware circuit, firmware, or a combination thereof.

Embodiments of the disclosure or components thereof can be provided as or represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor or controller to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor, controller or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A method of data compression for execution on a non-transitory computer readable medium having instructions that, if executed, cause a computer system to perform the method of data compression, the method comprising:
    combining, using the computer system, a set of fixed-size binary data structures into a set of single composite data structures wherein a single composite data structure is structured with a predetermined number of fixed-size binary data structures;
    aligning, using the computer system, bits of each single composite data structure with corresponding bits in the other single composite data structures;
    calculating, using the computer system, bit probabilities for each bit position of the single composite data structures;
    storing, using the computer system, the calculated bit probabilities as a bit probability data structure;
    constructing, using the computer system, a re-ordering model based on the bit probability data structure; and
    re-ordering, using the computer system, bits of each single composite data structure based on the re-ordering model to form intermediate buffers of each single composite data structure.

2. The method of claim 1 further comprising:
    traversing the intermediate buffers.

3. The method of claim 2 wherein traversing the intermediate buffers comprises:
    sorting the intermediate buffers in ascending order;
    traversing the sorted list of intermediate buffers.

4. The method of claim 3 wherein traversing the sorted list of intermediate buffers comprises:
    calculating a delta bit string between adjacent intermediate buffers in the sorted list of intermediate buffers; and
    encoding each delta bit string.

5. The method of claim 4 wherein calculating a delta bit string comprises:
    retrieving adjacent intermediate buffer pairs;
    subtracting a lower intermediate buffer value from a greater intermediate buffer value to calculate the delta bit string for the adjacent intermediate buffer pairs;
    repeating these steps for each adjacent intermediate buffer pair.

6. The method of claim 4 wherein encoding each delta bit string comprises:
    adding a header denoting a number of bits required for storage.

7. The method of claim 6 wherein encoding each delta bit string further comprises:
    encoding a starting bit buffer as a non-delta bit string.

8. The method of claim 4 wherein calculating a delta bit string comprises:
    retrieving adjacent intermediate buffer pairs;
    performing an bitwise XOR calculation for each intermediate buffer pair; and
    repeating these steps for each adjacent intermediate buffer pair within the sorted list of intermediate buffers.

9. The method of claim 8 wherein encoding each delta bit string comprises:
    adding a header denoting a number of bits required for storage.

10. The method of claim 3 wherein traversing the sorted list of intermediate buffers comprises:
    traversing each intermediate buffer from most significant bit to least significant bit;
    generating paths and branches of a fixed-depth binary tree structure based on the traversing;

at each leaf of the binary tree structure, encoding a location of the last branching point as branching point data;

encoding the branching point data by dumping the tree in known order;

removing a most encoded branch from the binary tree structure;

following encoded value back to last branch; and repeating these steps for each branch.

11. The method of claim 1 wherein re-ordering comprises: aligning the bit probabilities from a smallest variance to a largest variance.

12. A method of decompression for execution on a non-transitory computer readable medium having instructions that, if executed, cause a computer system to perform the method of decompression, the method comprising:

decoding, using the computer system, a non-delta bit string;

decoding, using the computer system, adjacent delta bit string based on non-delta bit string to form a decoded intermediate buffer; and converting, using the computer system, the decoded intermediate buffer to an integer.

13. The method of claim 12 wherein decoding data of adjacent delta bit string comprises:

adding the adjacent delta bit string to the non-delta bit string to produce the decoded intermediate buffer;

storing the decoded intermediate buffer as the non-delta bit string; and repeating these steps for adjacent intermediate buffer pairs.

14. The method of claim 12 further comprising:

bitwise XOR'ing the adjacent delta bit string to the non-delta bit string to produce the decoded intermediate buffer; and repeating these steps for adjacent intermediate buffer pairs.

15. A non-transitory tangible computer readable medium having stored thereon software instructions, that when executed by a processor, cause the processor to perform a method of data compression, the method comprising:

combining a set of fixed-size binary data structures into a set of single composite data structures wherein a single composite data structure is structured with a predetermined number of fixed-size binary data structures;

aligning bits of each single composite data structure with corresponding bits in the other single composite data structures;

calculating bit probabilities for each bit position of the single composite data structures;

storing the calculated bit probabilities as a bit probability data structure;

constructing a re-ordering model based on the bit probability data structure; and re-ordering bits of each single composite data structure based on the re-ordering model to form intermediate buffers of each single composite data structure.

* * * * *